United States Patent [19]

D'Asaro et al.

[11] Patent Number: 5,578,162
[45] Date of Patent: Nov. 26, 1996

[54] INTEGRATED COMPOSITE SEMICONDUCTOR DEVICES AND METHOD FOR MANUFACTURE THEREOF

[75] Inventors: Lucian A. D'Asaro, Madison; Donald W. Dahringer, Glen Ridge; Keith W. Goossen, Aberdeen; James A. Walker, Howell, all of N.J.

[73] Assignee: Lucent Technologies Inc., Murray Hill, N.J.

[21] Appl. No.: 366,864

[22] Filed: Dec. 30, 1994

Related U.S. Application Data

[63] Continuation-in-part of Ser. No. 83,742, Jun. 25, 1993, Pat. No. 5,385,632, and a division of Ser. No. 236,307, May 2, 1994, abandoned.

[51] Int. Cl.[6] .............................. H01L 21/00; B44C 1/22
[52] U.S. Cl. .................................... 156/630.1; 156/631.1; 148/33.4; 437/974
[58] Field of Search .......................... 156/630.1, 631.1, 156/633.1, 643.1, 657.1, 662.1; 437/86, 974; 257/9, 14, 17, 35; 148/33.4, 33.5

[56] References Cited

U.S. PATENT DOCUMENTS

| | | | |
|---|---|---|---|
| 5,244,818 | 9/1993 | Jokerst et al. | 437/974 X |
| 5,385,632 | 1/1995 | Goossen | 156/630.1 |

OTHER PUBLICATIONS

K. W. Goossen, G. D. Boyd, J. E. Cunningham, W. Y. Jan, D. A. B. Miller, D. S. Chemia, and R. M. Lum, "GaAs–AlGaAs Multiquantum Well Reflection Modulators Grown on GaAs and Silicon Substrates" in *IEEE Photon. Tech. Lett.*, vol. 1, p. 304, 1989.

P. Barnes, P. Zouganeli, A. Rivers, M. Whitehead, G. Parry, K. Woodbridge, and C. Roberts, "GaAs/AlGaAs Multiple Quantum Well Optical Modulator Using Multilayer Reflector Stack Grown on Si Substrate" in *Electron. Lett.*, vol. 25, p. 995, 1989.

P. Barnes, K. Woodbridge, C. Roberts, A. A. Stride, A. Rivers, M. Whitehead, and G. Parry, "GaAs multiple quantum well microresonator modulators grown on silicon substrates" in *Opt. Quantum Electron*, vol. 24, p.S A177, 1992.

K. W. Goossen, J. A. Walker, J. E. Cunningham, W. Y. Jan, D. A. B. Miller, S. K. Tweksbury, and L. A. Hornak, "Monolithic Integration of GaAS/AlGaAs Multiple Quantum Well Modulators and Silicon Metal–Oxide–Semiconductor Transistors" presented at the 1993 Quantum Optoelectronics meeting, Palm Springs, Calif.

J. Wielan, H. Melchior, M. Q. Kearly, C. Morris, A. J. Moseley, M. G. Goodwin, and R. C. Goodfellow "Optical Receiver Array In Silicon Bipolar Technology With Self-aligned, Low Parasitic III/V Detectors For DC–1 Gbits/s Parallel Links" in *Electron Lett,*, vol. 27, p. 2211, 1991.

WR C. Camperi–Ginestet, M. Hargis, N. Jokerst, and M. Allen, "Alignable Epitaxial Liftoff of GaAs Materials with Selective Deposition Using Polyimide Diaphragms", *IEEE Photon. Tech. Lett.* vol. 3, 1123, 1991.

*Primary Examiner*—William Powell

[57] ABSTRACT

An integrated semiconductor device is formed by bonding the conductors of one fabricated semiconductor device having a substrate to the conductors on another fabricated semiconductor device having a substrate, flowing an etch-resist in the form of an uncured cement (e.g. epoxy) between the devices, allowing the etch-resist to solidify, and removing the substrate from one of the semiconductor devices. Preferably the etch-resist epoxy is retained to impart mechanical strength to the device. More specifically, a hybrid semiconductor device is formed by bonding the conductors of one or more GaAs/AlGaAs multiple quantum well modulators to conductors on an IC chip, wicking an uncured epoxy between the modulators and the chip, allowing the epoxy to cure, and removing the substrate from the modulator.

19 Claims, 6 Drawing Sheets

INTEGRATED COMPOSITE SEMICONDUCTOR DEVICES AND METHOD FOR MANUFACTURE THEREOF

REFERENCE TO COPENDING APPLICATIONS

This application is a continuation-in-part of the application Ser. No. 083,742, filed Jun. 25, 1993, now U.S. Pat. No. 5,385,632, and divisional application Ser. No. 08/236,307, filed May 2, 1994, now abandoned, both for Integrated Semiconductor Devices and Method for Manufacture Thereof, and both assigned to the same assignee as this application.

FIELD OF THE INVENTION

This invention relates to bonding of fully-fabricated semiconductor devices onto other fully-fabricated semiconductor devices so as to produce integrated units, and particularly to bonding fully-fabricated photonic elements, such as GaAs/AlGaAs multiple quantum well (MQW) modulators, onto fully-fabricated integrated circuit (IC) chips such as Si or even GaAs.

BACKGROUND OF THE INVENTION

Integration of photonic devices with silicon IC chips makes it possible to combine the advantages of each. Among photonic devices, GaAs/AlGaAs multiple quantum well (MQW) modulators are particularly beneficial as input/output (I/O) elements on IC chips because they have a high absorption coefficient of light and can serve as both receivers and transmitters. They typically operate at an optical wavelength ($\lambda$) of 850 nm (nanometers).

Growing GaAs/AlGaAs on fully-fabricated IC chips has proven difficult because it subjects the IC chips to damage. On the other hand, techniques exist for bonding fully-fabricated semiconductor devices to each other. However, these leave the substrates of each device in place. This subjects the bonds to adverse mechanical stresses that may affect the devices adversely. In the case of GaAs/AlGaAs multiple quantum well (MQW) modulators, the substrates are GaAs which are opaque to the operating wavelength of the GaAS/AlGaAs modulators, and hence require removal for operation. Nevertheless, it is very difficult to place and bond GaAs/AlGaAs multiple quantum well (MQW) modulators, if they have had their substrates removed, onto silicon IC chips.

Prior techniques for bonding fully-fabricated semiconductor devices to each other, and in particular multiple quantum well (MQW) modulators to silicon IC chips, suffer the disadvantages of mechanical stress, opacity, or cumbersome handling.

An object of the invention is to overcome these disadvantages.

SUMMARY OF THE INVENTION

According to an aspect of the invention we achieve such objects by bonding the conductors of one fabricated semiconductor device having a substrate to the conductors on another fabricated semiconductor device having a substrate, flowing an etch-resist in the form of an uncured cement between the devices, allowing the etch-resist to solidify, and removing the substrate from one of the semiconductor devices.

According to another aspect of the invention, one semiconductor device is a device having one or more GaAs/AlGaAs multiple quantum well modulators and the other semiconductor device is an IC chip, and the substrate on the device with the GaAs/AlGaAs multiple quantum well modulator is removed.

According to another aspect of the invention, the etch-resist is an epoxy and is left to impart mechanical strength to the device.

According to another aspect of the invention, the etch resist, e.g. epoxy, is completely or partially removed.

These and other aspects of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
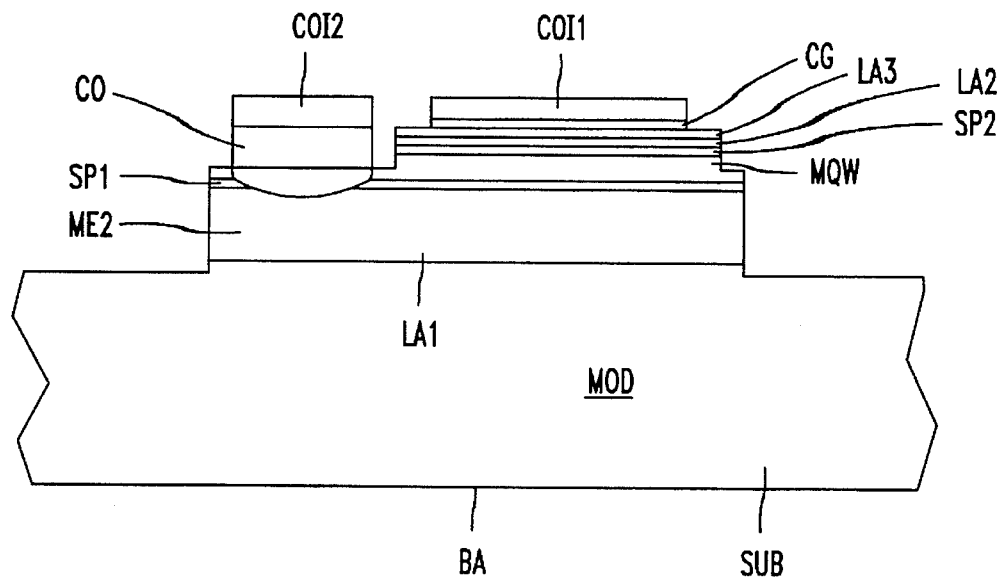
FIG. 1 is a cross-sectional view illustrating a photonic device in the form of an MQW modulator containing a multiple quantum well modulator unit.

FIGS. 1–4 illustrate a GaAs/AlGaAs 850 nm $\lambda$ multiple quantum well modulator MOD, and a solder-bonding technique for integrating the GaAs/AlGaAs 850 nm $\lambda$ modulator with an IC to form the device embodying the invention. FIG. 1 illustrates a multi-strata multiple quantum well modulator MOD for bonding to contacts on a Si device according to the invention.

In the modulator MOD, a GaAs substrate SUB supports a 1.5 µm layer LA1 of n (i.e. n-doped) ($10^{18}$ cm$^{-3}$) $Al_{0.3}Ga_{0.7}As$ grown on the substrate SUB. A 100 Å i (i.e. intrinsic) $Al_{0.3}Ga_{0.7}As$ spacer SP1 on the layer LA1 spaces the latter from an i multiple quantum well modulator unit MQW composed of 55 periods of 90 Å GaAs wells and 30 Å $Al_{0.3}Ga_{0.7}As$ barriers. A 70 Å i $Al_{0.3}Ga_{0.7}As$ spacer SP2 on the multiple quantum well modulator unit MQW spaces the latter from a 500 Å p (i.e. p-doped) ($10^{18}$ cm$^{-3}$) $Al_xGa_{1-x}As$ layer LA2 graded from X=0.3 to x=0, on the spacer SP2. A 500 Å p$^+$ ($5*10^{18}$ cm$^{-3}$) GaAs layer LA3 covers the layer LA2.

The modulator MOD, at the substrate SUB, forms a 5 mm square piece and has 110×110 μm gold p contacts CG (1000 Å thick) deposited on the layer LA3. The strata MQW, SP2, LA2, LA3, and CG form a 130×130 μm inner mesa ME that extends to within 1500 Å of the n layer LA1. A 50×120 μm, 7000 Å thick, AuGe/Au n contact CO on the n layer LA1 extends upwardly to make its top coplanar with the gold p contact CG. 4000 Å In caps COI1 and COI2 cover respective contacts CG and CO.

Manufacture of the modulator MOD utilizes gas-source molecular beam epitaxy. The structure in FIG. 1, is manufactured according to the following steps:

Growing the GaAs substrate SUB.

Growing the 1.5 μm layer LA1 of n (i.e. n-doped) ($10^{18}$ cm$^{-3}$) $Al_{0.3}Ga_{0.7}As$ on the substrate SUB.

Growing the 100 Å i $Al_{0.3}Ga_{0.7}As$ spacer SP1 on the layer LA1.

Growing, on the spacer SP1, the i (i.e. intrinsic) multiple quantum well modulator unit MQW composed of 55 periods of 90 Å GaAS wells and 30 Å $Al_{0.3}Ga_{0.7}As$ barriers.

Growing the 70 Å i $Al_{0.3}Ga_{0.7}As$ spacer SP2 on the multiple quantum well modulator unit MQW.

Growing the 500 Å p (p-doped) ($10^{18}$ cm$^{-3}$) $Al_xGa_{1-x}As$ layer LA2 graded from X=0.3 to x=0, on the spacer SP2.

Growing the 500 Å p$^+$ ($5*10^{18}$ cm$^{31\ 3}$) GaAs layer LA3 on the layer LA2.

The procedure continues with:

Processing the edges to the 5 mm square piece of the modulator MOD to the shape shown in FIG. 1.

Depositing the 110×110 μm gold p contacts CG (1000 Å thick) on the layer LA3.

Figure 2:
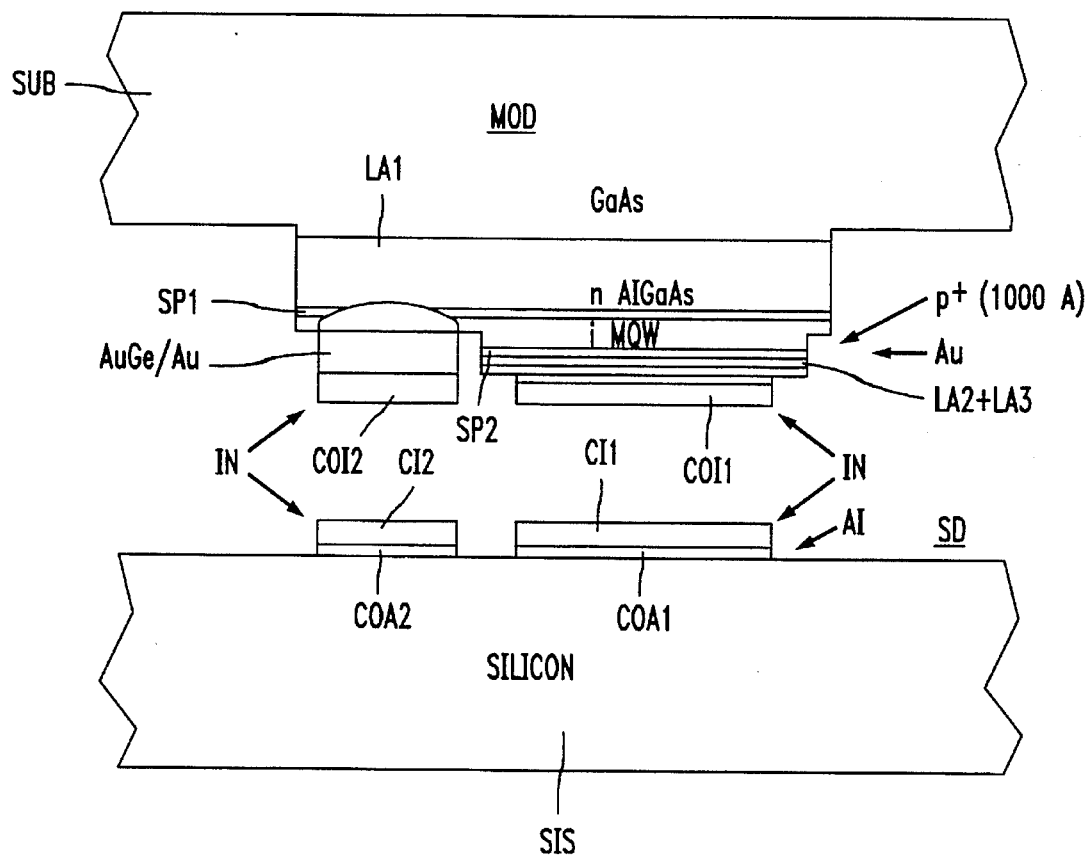
FIG. 2 is a cross-sectional view illustrating an arrangement in a step for forming a device that integrates the multiple quantum well modulator with an integrated circuit chip according to aspects of the invention.

Etching the 130×130 μm inner mesa ME1 around the gold contacts to within 1500 Å of the n layer LA1 as shown in FIG. 2.

Deposition of the 50×120 μm, 7000 Å thick, AuGe/Au n contact CO on the n layer LA1. The contact CO is that thick in order to make its top coplanar with the gold p contact CG.

Deposition of the 4000 Å In caps CA on both contacts CG and CO.

Etching the 200×200 μm outer mesa ME2 down into the substrate SUB.

Alloying the contacts CG and CO at 420° C. for 1 minute.

Thinning the modulator MOD to 200 μm.

Polishing the back of the substrate SUB for viewing through an infrared microscope.

This completes the modulator MOD. FIG. 2 illustrates the modulator MOD upside down in position above a portion of a Si device SD, such as an IC chip, as a step in formation of the integrated hybrid device embodying the invention. In FIG. 2 the device SD includes a 1 cm square p type Si substrate SIS with Al contacts COA1 and COA2 of the same size and spacing as the p and n contacts CG and CO on the modulator MOD. These Al contacts COA1 and COA2 are set to extend out of the page of FIG. 2 so that they would be exposed when the hybridization process is completed according to an embodiment of the invention. Indium contacts CI1 and CI2 on the Al contacts also have the same size and spacing as the modulator contacts CG and CO.

To integrate the modulator MOD with an IC chip, the following occurs:

Patterning a 1 cm square p type Si substrate SIS with Al contacts COA1 and COA2 of the same size and spacing as the p and n contacts CG and CO on the modulator MOD. These Al contacts COA1 and COA2 are set to extend out of the page of FIG. 2 so that they would be exposed upon completion of the hybridization process according to an embodiment of the invention.

Depositing indium contacts COI1 and COI2 on the Al with the same size and spacing of the modulator contacts CG and CO.

Placing the modulator MOD upside down on the Si piece and aligning it. According to an embodiment of the invention, a precision controller aligns the modulator MOD on the Si device SD.

Figure 3:
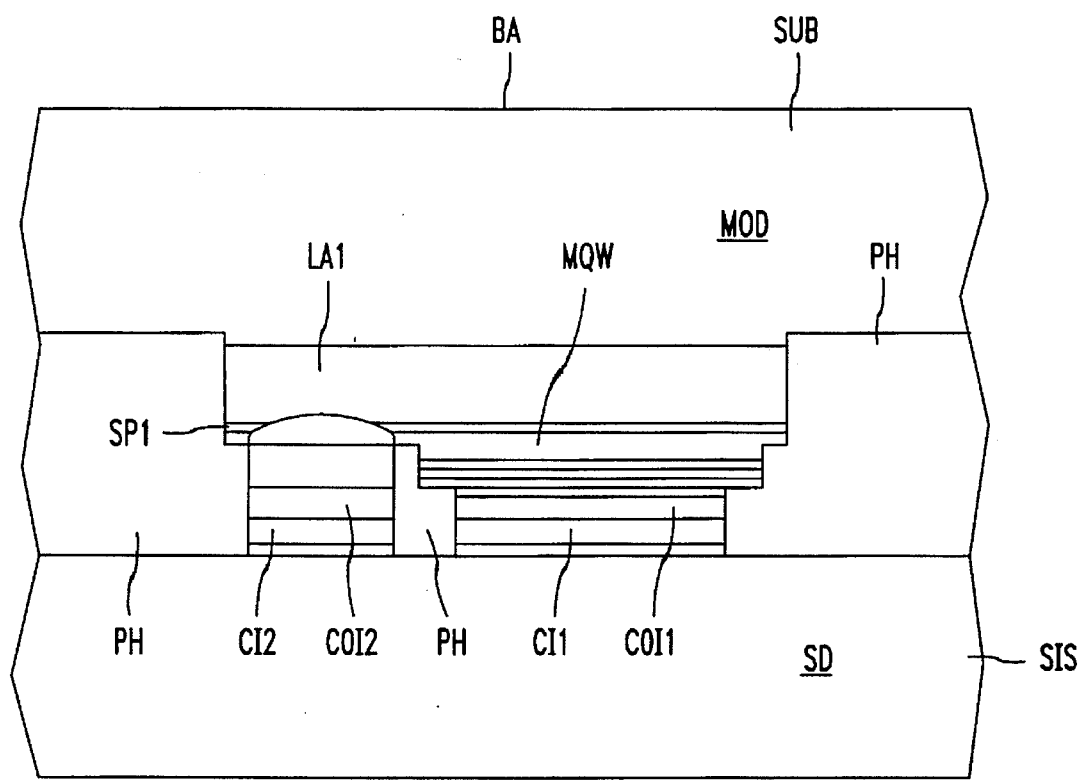
FIG. 3 is a cross-sectional view illustrating an arrangement in another step for forming a device integrating the multiple quantum well modulator with an integrated circuit chip according to aspects of the invention.

FIG. 3 shows the modulator MOD on the Si device SD with the In contacts COI1 and COI2 bonded to the contacts CI1 and CI2. Here AZ4210 photoresist PH surrounds the contacts CG, CO, COI1, COI2, COA1, COA2, CI1 and CI2. The structure in FIG. 3 is achieved by the following steps.

Heating the unit to 200° C. for 15 minutes to melt the indium contacts into each other. At this point the resulting unit is relatively stable (i.e., shaking does not cause it to break apart).

Flowing AZ 4210 photoresist between the modulator MOD and the Si device SD by depositing drops of photoresist PH on the Si substrate about the GaAs/AlGaAs modulator MOD and allowing it to flow against its edge.

Air drying the photoresist PH for 12 hours. The dried photoresist PH serves two purposes. First, it protects the modulator MOD during substrate etching. Second, it provides additional mechanical support.

Figure 4:
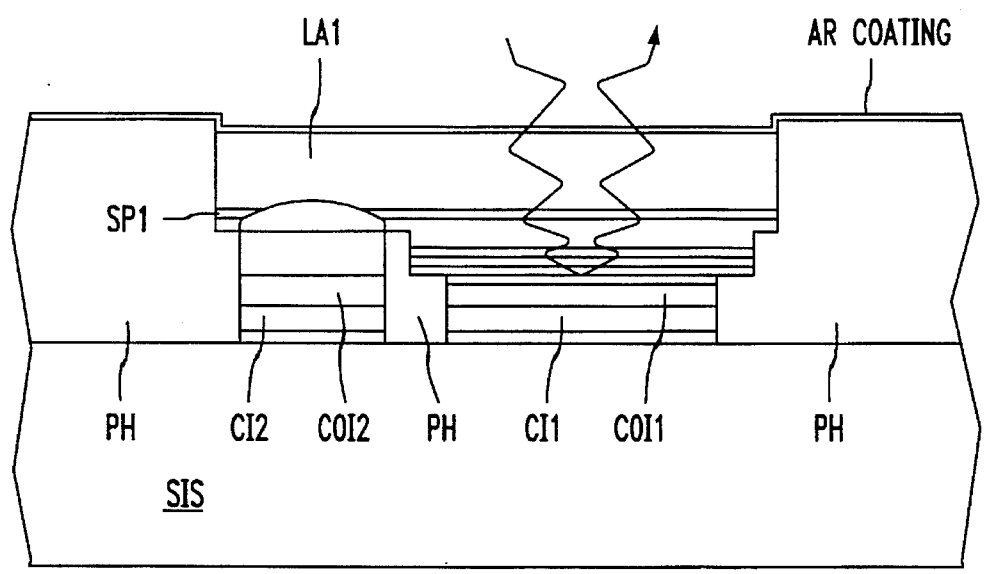
FIG. 4 is a cross-sectional view illustrating a device integrating a photonic element with an electronic element and embodying aspects of the invention.

FIG. 4 illustrates a structure embodying the invention. Here an AR coating covers the MQW modulator MOD and the surrounding photoresist PH. This structure is the result of the following steps.

Placing a drop of KOH solution on the surface of the exposed GaAs to remove any GaAs oxide.

Chemically removing the GaAs substrate SUB from the modulator MOD with a jet etcher by delivering a 1×1 mm jet of enchant onto the surface of the substrate SUB. The enchant is 100:1 $H_2O_2$:$NH_4OH$, which stops on the $Al_{0.3}Ga_{0.7}As$ layer LA1. The GaAs enchant does not attack the photoresist appreciably nor Si or Al to the sides of the GaAs/AlGaAs modulator. However, care is taken to quickly deliver the unitary structure into the enchant jet after applying the KOH, because KOH does attack photoresist. The enchant etches the substrate SUB in about 1.5 hours.

To prepare the integrated hybrid unit for use, the Al contacts sticking out from underneath the modulators are probed by poking the probes through the photoresist. These probes then provide connections to the terminals on the hybrid structure.

According to an embodiment of the invention, bond pads extend to the edge of the silicon and the photoresist is applied without coating them. According to another embodiment of the invention, the chip is wire-bonded and packaged before commencing the process.

After wire-bonding the Al pads of a modulator MOD, an SiOx AR-coating AR is deposited. The gold p contact cg served as an integral reflector.

Yet another embodiment of the invention involves selective photo-chemical removal of the photoresist PH at the bond pads.

Another embodiment includes using a solvent to remove the photoresist completely. This leaves the integrated device of Si chip and modulator MOD without the mechanical support of the etch resist, but also without the mechanical burden of the substrate SUB.

Samples of the integrated hybrid unit have been fabricated with the photoresist remaining on the structure. In tests made, it was possible to completely remove the 5×5 mm substrate without damaging any section. Since the outer mesas of the modulators MOD were etched into the substrate the photoresist PH completely isolates the integrated structure.

According to an embodiment of the invention, the single modulator MOD and the single connection to the Si device SD of FIGS. 1 to 4 represents but one of a number of an array of modulators MOD. Each of the latter is grown on a single substrate and bonded to corresponding contacts on the device SD with the single substrate SUB then removed.

Figure 5:
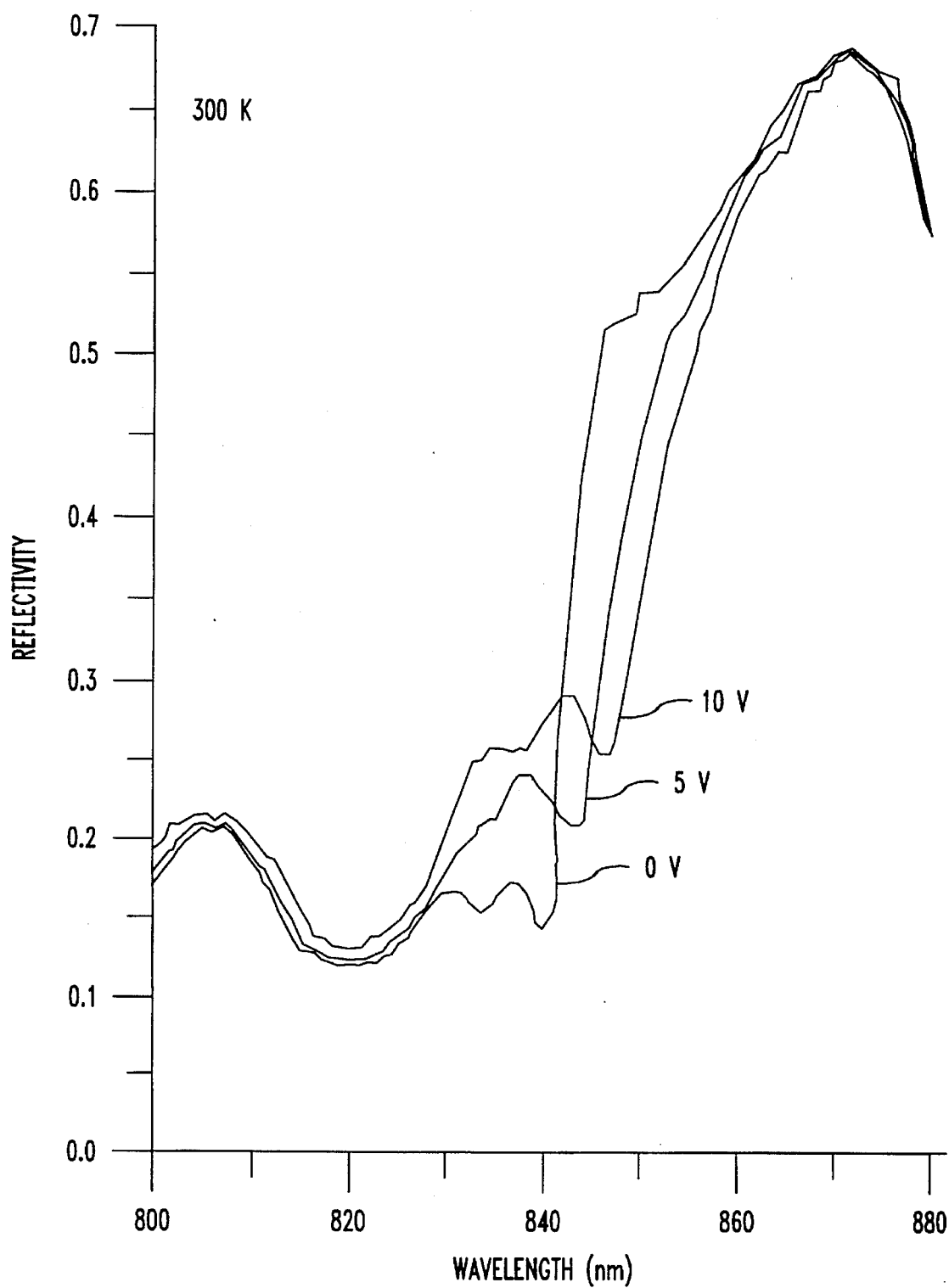
FIG. 5 is graph illustrating the reflectivity spectra of the MQW modulator embodying the invention under different reverse biases.

FIG. 5 shows the reflectivity spectra of a modulator MOD under different reverse biases, measured with a lamp/monochromator. Near an optical wavelength of 850 nm, a reflectance change from 52% to 26% occurs for a 0 to 10 volt bias swing.

Figure 6:
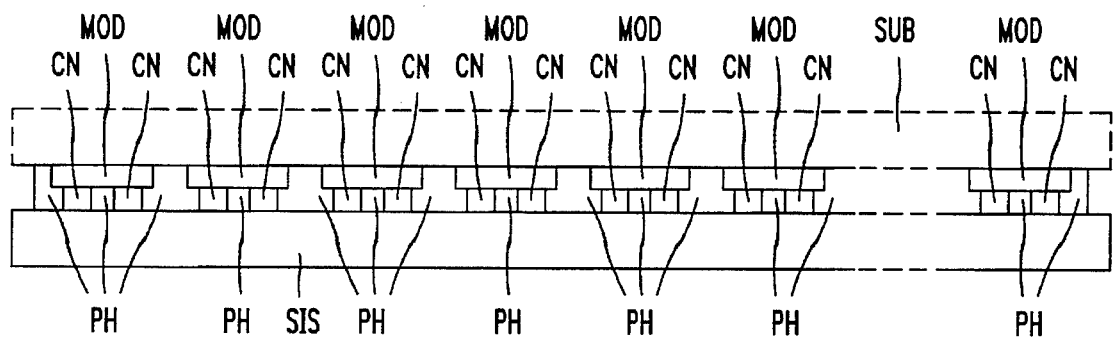
FIG. 6 is a cross-sectional view illustrating a device integrating a number of photonic elements on an IC and embodying aspects of the invention.

FIG. 6 is a cross-sectional view illustrating a device integrating a number of photonic elements with electronic elements of an IC chip and embodying aspects of the invention. Here, a number of modulators MOD, identical to the modulators MOD in FIG. 4, are bonded via bonded contacts CN collectively representing the contacts CG, CO, COI1, COI2, COA1, COA2, CI1 and CI2 to the substrate SIS of a Si device SD. The bonding process is the same as the process in FIGS. 2 to 4 except that all the modulators MOD start on a single substrate SUB and the Si device includes a number of conductor pairs each matching the conductor pair of the modulator MOD above that pair. Photoresist PH extends between and around the contacts CN and the modulators MOD. A single previously-removed substrate SUB for the modulators MOD appear in phantom lines. The photoresist PH also extends between the substrate SIS and the level of the removed substrate SUB.

Figure 7:
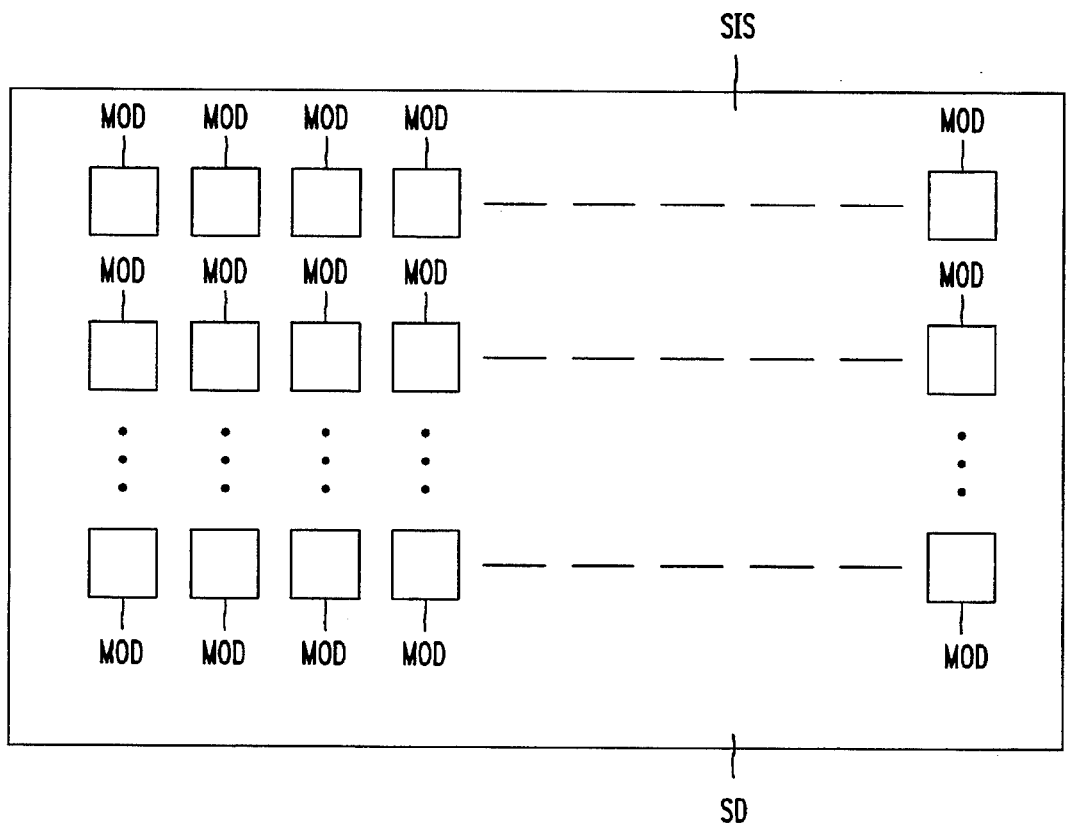
FIG. 7 is a plan view illustrating a device integrating an array of photonic elements on an IC and embodying aspects of the invention.

FIG. 6 shows a single line of modulators MOD. The invention contemplates two dimensional arrays of such modulator MOD as shown in FIG. 7. Because optical input/outputs (I/O's), such as the multiple quantum well modulators MOD, permit transmission and reception normal to the surface of the chip, such two-dimensional arrays offer substantial possibilities for use in hybrid communication and information processing environments.

According to another embodiment of the invention, the photoresist PH is removed from the structures of FIGS. 6 and 7.

In operation, the output of an off-chip laser splits into an array of spots and focuses on the multiple quantum well modulators MOD, whose reflectance is modulated by the on-chip electronics. This type of system offers the advantage of having a global clock (for oscillating the laser). In addition, it is because such modulators are also efficient detectors that the one modulator can function as both receiver and transmitter.

According to another embodiment of the invention, instead of a photoresist, the etch resist used is an epoxy having a viscosity low enough to wick between the quantum well modulator, or modulators, MOD and the silicon device SD. For this purpose, the epoxy preferably has a viscosity of less than one poise when it is being applied. In practice, epoxies tend to have lower viscosity at elevated temperatures. Thus the epoxy is applied while maintaining the modulator, or modulators, MOD and the silicon device SD at an elevated temperature, such as 100° C. The latter temperature is lower than the melting point of the solder on the modulator and silicon device. A preferred epoxy is composed of two components, and cures only after a delay following mixing of the components. Such a delay permits application of the epoxy before hardening. Any epoxy that satisfies the viscosity conditions and is resistant to the substrate-removal etch is suitable. This includes cements that cure on the application of heat without emitting gas or liquid solvents and that set permanently. The term cement is used herein to include epoxies and other cements. A preferred epoxy is available under the trademark Able Bond 931-1 manufactured by Able-Stick Laboratories, a subsidiary of National Starch and Chemical Company, Rancho Dominguez, Calif. 90221. Such an epoxy has low viscosity at room temperature and is stored at −40° C.

Figure 8:
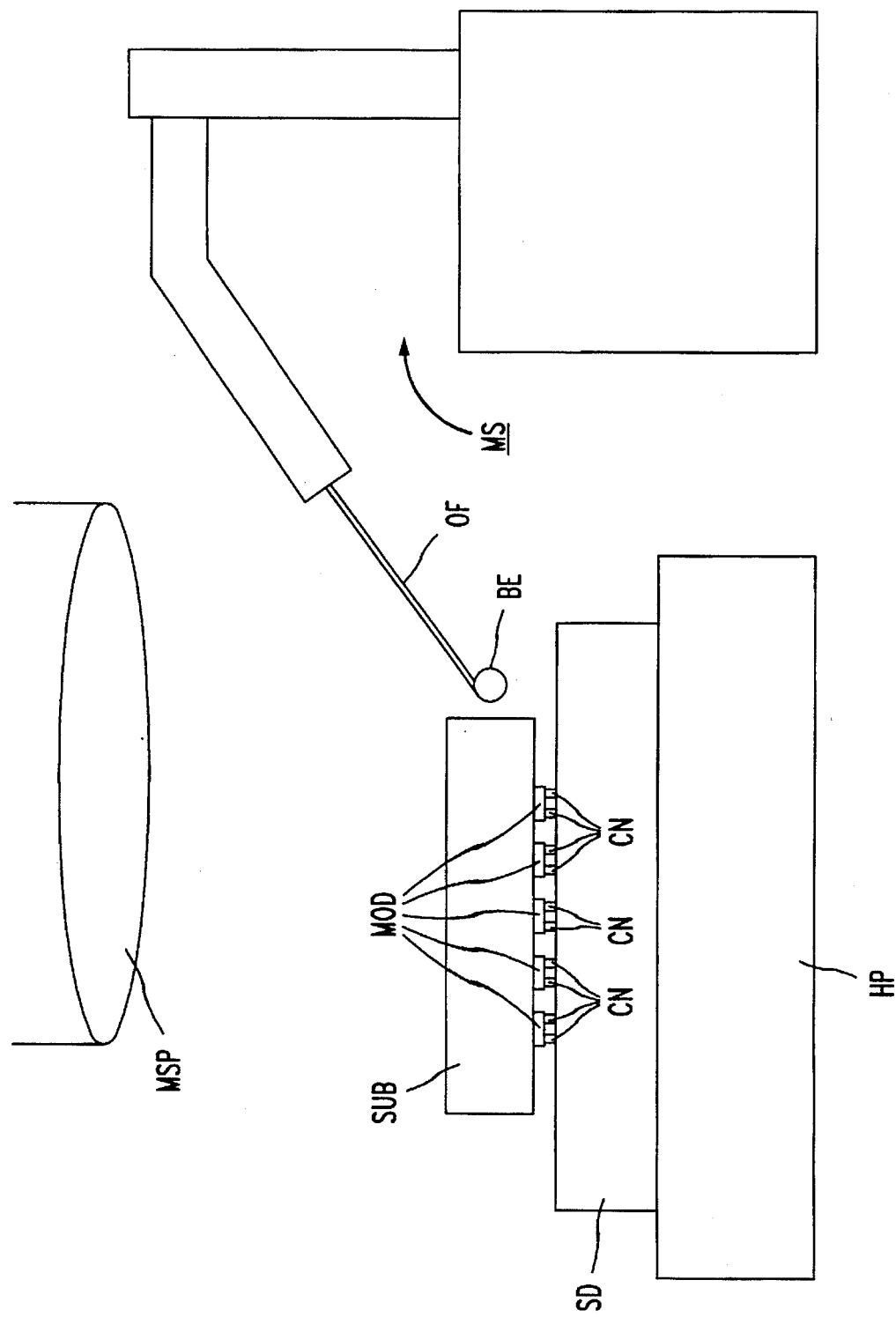
FIG. 8 is a schematic diagram of a system illustrating an arrangement for performing steps in the manufacture of the device according to aspects of the invention.

FIG. 8 illustrates the manner of applying the epoxy to a structure such as shown in FIG. 6 and composed of a substrate SUB with a number of modulators MOD connected by contacts CN to the silicon device SD. This process involves dipping an optical fiber OF into an uncured, so as to place a bead BE of the epoxy onto the tip of the fiber. A micrometer stage MS holds the fiber OF and allows controlled movement in all directions. While the modulators MOD and the silicon device SD are being viewed through a microscope MSP, the micrometer stage MS places the tip of the fiber OF onto the side of the substrate SUB near the silicon device SD so that the epoxy bead touches the corner or gap formed between the substrate and the silicon device. The epoxy then wicks between the substrate SUB and the silicon device SD and around the modulators MOD. The modulators MOD and the silicon device SD rest on a heated platform HP to elevate their temperatures to 100° C. during application of the epoxy to reduce the viscosity further. Several epoxy beads may be wicked between the substrate SUB and the silicon device SD until the volume between them and the modulators MOD fills. The epoxy is then cured by placing the modulators MOD and the silicon device SD with the epoxy into an oven at 100° C. for one hour.

Figure 9:
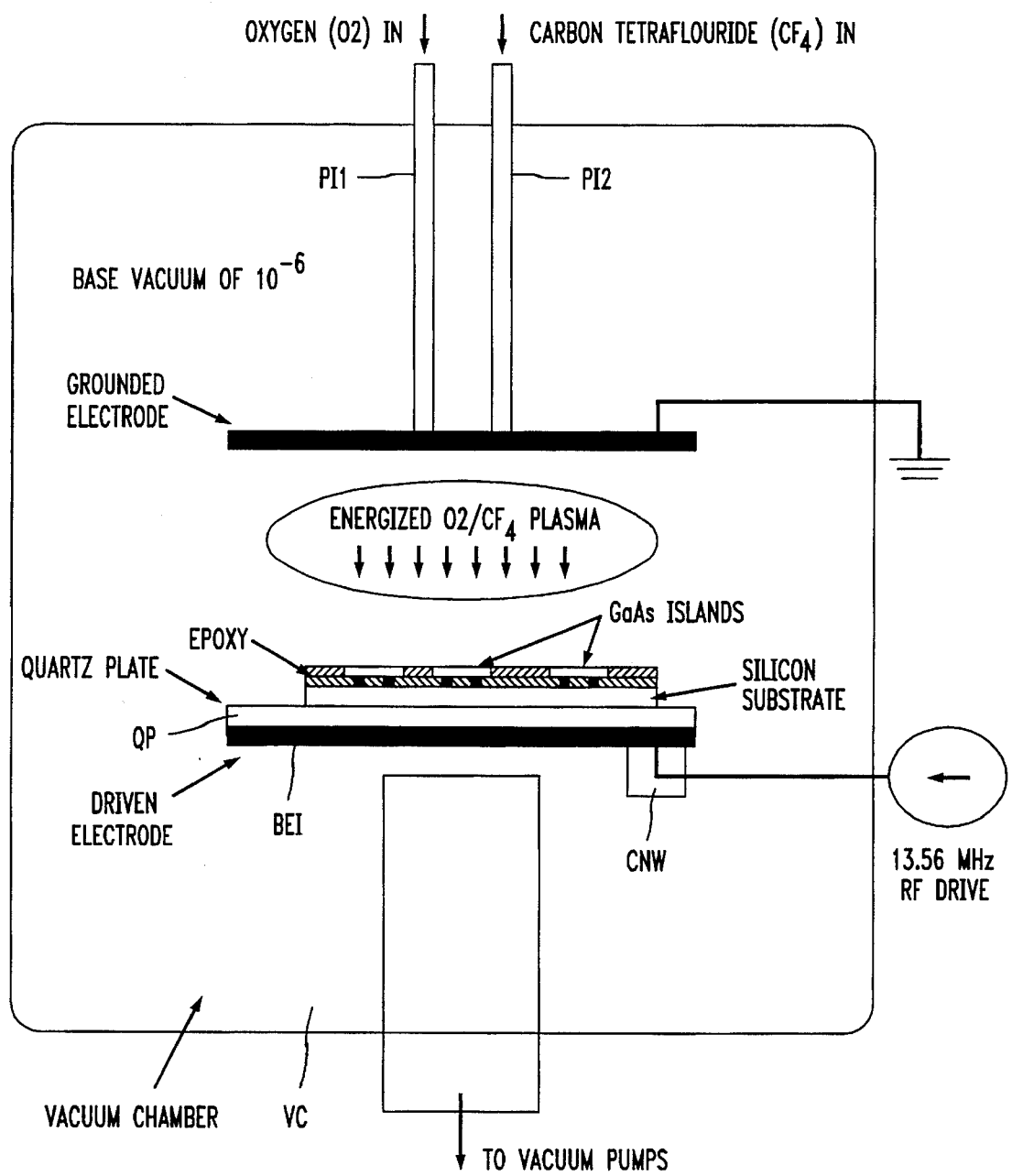
FIG. 9 is a schematic diagram of a system illustrating an another arrangement for performing steps in the manufacture of the device according to aspects of the invention.

According to one embodiment of the invention, the epoxy is left on the device after the substrate SUB has been removed from the modulators, MOD. According to another embodiment the epoxy remaining after removal of the substrate SUB, or a portion thereof, is also removed. For this purpose of taking off the epoxy, the integrated semiconductor composed of the modulators MOD and the silicon device SD is loaded into a vacuum chamber VC as shown in FIG. 9. Here, the composite of the modulators MOD and the silicon device SD sits on a quartz plate QP. A thermally conductive vacuum grease bonds the quartz plate QP to a bottom electrode BE1 of a conductive metal such as aluminum. Vacuum pumps, connected to the chamber VC, pump the chamber to a base pressure in the $10^{-6}$ Torr range. After the base pressure continues for 10 minutes, respective pipes PI1 and PI2 inject oxygen ($O_2$) and carbon tetraflouride ($CF_4$) into the chamber VC. At this time, the vacuum pump is throttled back to achieve an operating pressure of approximately 65 mTorr. The oxygen flow is set at 20 standard cubic centimeters per minute (sccm) and the $CF_4$ is set at 4 sccm.

The bottom electrode BE1 is water cooled to maintain a given temperature, for example 23° C. Once the gas flow and pressure are stabilized, a grounded upper electrode UE1 and the bottom electrode BE1 apply a drive signal, such as 80 Watts at 13.56 MHz. A capacitive network CNW attached to the bottom electrode BE is tuned to achieve a minimum reflected RF power condition. The power is then adjusted until a 200 volt D.C. self-bias condition exists between the upper electrode UE1 and the bottom electrode BE1. These conditions of D.C. bias, pressure, temperature, and gas flows, are maintained for 40 minutes to produce plasma erosion of the exposed epoxy film (approximately 5 microns) without damage to the modulator, or modulators, MOD or silicon device SD. Any plasma containing oxygen or oxygen containing substances is suitable for removing the epoxy or other cements.

The invention furnishes a technique for solder-bonding one semiconductor device onto another and removing the substrate from one. In particular the invention provides a method of bonding GaAs/AlGaAs 850 nm λ modulators onto silicon. According to an embodiment of the invention this technique forms whole arrays of devices in one step. This technique provides a method for optoelectronic integration of silicon IC's.

The invention enables the substrate of the optical GaAs/AlGaAs modulator to be removed after it is solder-bonded to a silicon chip. Removal of the substrate is necessary since it is opaque to light at the wavelength needed for operation. In addition, substrate removal alleviates mechanical constraints on the bond. The invention involves flowing of an etch-resist, such as a photoresist or epoxy, between the chips to allow etching of the substrate. The flow may be enhanced by capillary action. The photoresist or epoxy protects the front sides of the chips during etching and augments mechanical support. The technique has survived several tests of robustness and will support fabrication of large arrays. Although simple, the invention permits the joining of complex electronic circuits with optical inputs and outputs in large numbers.

The invention involves GaAs/AlGaAs p-i-n multiple quantum well modulators solder-bonded to a silicon substrate. The GaAS substrate is chemically removed to allow operation at an optical wavelength of 850 nm. The gold contact to the modulator is used as the reflector. The invention achieves a change in reflectivity from 26% to 52% for 0 to 10 volts bias swing.

The invention promotes the use of photonics in an information processing environment where it is integrated with electronics. The invention takes advantage of the greater capacity of electronics for complexity, functionality, and memory, and the greater capacity of photonics for communications. The photonic devices, such as the multiple quantum well modulators, function as optical interconnects between electronic integrated circuit chips (IC's). The invention involves the integration of photonic elements (both receiver and transmitter) on the IC chip. It takes advantage of the attractive feature of optical input/output (I/O) that it can occur normal to the surface of the chip, and allow two-dimensional arrays of interconnects to be formed, for surface-normal photonic operation.

The invention takes advantage of silicon electronics's effective technology where complex systems such as microprocessors or memory are concerned. It offers the benefit of increased communication capacity to the IC chip when the chip contains a great number of computing elements.

One of the advantages of GaAs/AlGaAs multiple quantum well modulators is their typical operation at 850 nm. This short wavelength allows the formation of small optical spots whose potential spot sizes vary with the wavelength The structure and process described in connection with FIGS. 1 to 4 represent a single example of a integrated semiconductor device which was constructed and tested, and gave the results in FIG. 5. Other embodiments of the invention use other dimensions, particularly area dimensions, and different materials. For example any suitable etch-resist, that is any polymer that resists the enchant and that dries into a mechanically sound solid corresponding to a photoresist, i.e. an epoxy, may substitute for the photoresist AZ 4210. The term etch-resist as used herein refers to any polymer that dries to protect an underlying solid from the enchant and includes a photoresist and an epoxy. For embodiments which retain the etch-resist for mechanical support, a suitable etch-resist for use herein is one that becomes sufficiently solid furnish mechanical support, i.e. an epoxy. In embodiments which have the etch-resist removed, the etch resist need not display the supporting mechanical strength.

Moreover the contacts on each semiconductor device need not be coplanar, as long as they complement the heights of the Si-mounted contacts to which they are to be bonded. Also, as an example, the bonding material need not be indium (In). According to other embodiments of the invention, the contacts are gold, or various mixtures of In, Au, Sn, and/or Pb.

Furthermore, the Si device SD need not be a Si IC chip. The Si device SD may be any fully-fabricated semiconductor device such as one made of GaAs. The invention prevents the damage to the semiconductor device which would be caused by growing of one device on the other fully-fabricated device.

According to an embodiment of the invention, not only epoxy, but any insulating cement may be used where the epoxy is used as long as the cement's viscosity permits wicking between the substrates and, upon solidifying, furnishes mechanical strength to the device and provides etch resistance. The term cement is used herein generically to include air drying thermoplastics, and thermosetting materials such as epoxies, acrylics, and urethanes. The term cured is used herein to mean solidified, and the term uncured refers to the cement in its liquid state.

The term "insulating cement" refers to the cement in its solidified, i.e. cured, form. Preferably it is insulating in its liquid form also but may have non-insulating properties in liquid form.

While embodiments of the invention have been described in detail, it will be evident to those skilled in the art that the invention may be embodied otherwise without departing from its spirit and scope.

What is claimed is:

1. The method of forming an integrated semiconductor device, comprising the steps of:

bonding conductors of a first semiconductor device having a substrate to conductors on a second semiconductor device (MOD) having a substrate (SUB);

flowing an etch-resist in the form of an uncured cement to fill a space between the first semiconductor device and the second semiconductor device;

allowing the cement to cure; and removing the substrate from the second semiconductor device.

2. The method as in claim 1 wherein the cement is an epoxy.

3. The method as in claim 1, wherein the step of flowing includes flowing the uncured cement between and around said conductors.

4. The method as in claim 1, wherein the step of bonding includes forming surfaces of any one of a group consisting of In, Au, and mixtures of In, Au, Sn, and Pb on the conductors.

5. The method as in claim 3, wherein the cement is an epoxy and the step of flowing includes wicking the uncured cement between the first and second substrates while the conductors are at temperatures above room temperature.

6. The method as in claim 1, wherein the step of flowing includes flowing sufficient cement so that said cement, when dried, forms a structural support from one of the semiconductor devices to the other.

7. The method as in claim 1, wherein the second semiconductor device is a photonic device and the first semiconductor device is a Si device.

8. The method as in claim 1, wherein the second semiconductor device (MOD) includes a modulator having a GaAs/AlGaAs multiple quantum well modulator unit and said first semiconductor device includes a Si integrated circuit chip.

9. The method as in claim 1, wherein said second semiconductor device includes:

a GaAs portion forming said substrate of said second semiconductor device;

an n-doped AlGaAs layer;

a multiple quantum well modulator unit (MQW) including GaAs wells and AlGaAs barriers;

a p-doped AlGaAs layer; and a plurality of gold contacts, one contacting said n-doped AlGaAs layer and one contacting said p-doped AlGaAs layer.

10. A method as in claim 1, wherein the cement is an epoxy, and the step of removing includes selectively removing a portion of the epoxy with a plasma.

11. A method as in claim 10, wherein the plasma is an energized $O_2SF_6$ plasma under vacuum pressure while heating a first substrate.

12. An integrated semiconductor device, comprising:

a first semiconductor device having a substrate and conductors;

a second semiconductor device (MOD) without a substrate and with conductors (COI1, COI2);

said conductors on said first semiconductor device being bonded to said conductors on said second semiconductor device;

cement extending between said first and second semiconductor devices.

13. A device as in claim 12, wherein said cement is an epoxy and extends between and around said conductors and around said semiconductor devices.

14. A device as in claim 12, wherein said conductors on said first semiconductor device are coplanar, and said conductors on said second semiconductor device are coplanar.

15. A device as in claim 13, wherein said epoxy forms a structural support from said first semiconductor device to said second semiconductor device.

16. A device as in claim 12, wherein said second semiconductor device is a photonic device and said first semiconductor device is a Si device.

17. A device as in claim 12, wherein said second semiconductor device includes a GaAs/AlGaAs multiple quantum well modulator and said first semiconductor device includes a Si integrated circuit chip.

18. An intermediate device as in claim 12, wherein said second semiconductor device includes:

a GaAs substrate (SUB);

an n-doped AlGaAs layer (LA1);

a multiple quantum well modulator unit (MQW) including GaAs wells and AlGaAs barriers;

a p-doped AlGaAs layer (LA1);

a plurality of gold contacts (CO, CG), one contacting said n-doped AlGaAs layer and one contacting said p-doped AlGaAs layer.

19. The method as in claim 3, wherein the cement is an epoxy and the step of flowing includes wicking the uncured cement between the first and second substrates at room temperature, namely 20° C.

* * * * *